United States Patent [19]

Shekar et al.

[11] Patent Number: 5,317,171
[45] Date of Patent: May 31, 1994

[54] MOS GATED THYRISTOR WITH REMOTE TURN-OFF ELECTRODE

[75] Inventors: Mallikarjunaswamy S. Shekar; Bantval J. Baliga, both of Raleigh, N.C.

[73] Assignee: North Carolina State University, Raleigh, N.C.

[21] Appl. No.: 875,742

[22] Filed: Apr. 29, 1992

[51] Int. Cl.⁵ ............... H01L 29/100; H01L 29/600; H01L 29/740

[52] U.S. Cl. ................. 257/138; 257/139; 257/147

[58] Field of Search .......... 257/139, 140, 142, 144, 257/141, 143, 137, 138

[56] References Cited

U.S. PATENT DOCUMENTS

| | | |
|---|---|---|
| 4,132,996 | 1/1979 | Baliga . |
| 4,165,517 | 8/1979 | Temple et al. . |
| 4,466,173 | 8/1984 | Baliga ................... 29/571 |
| 4,569,118 | 2/1986 | Baliga ................... 29/571 |
| 4,571,815 | 2/1986 | Baliga ................... 29/571 |
| 4,587,712 | 5/1986 | Baliga ................... 29/571 |
| 4,663,547 | 5/1987 | Baliga et al. . |
| 4,799,095 | 1/1989 | Baliga . |
| 4,827,321 | 5/1989 | Baliga . |
| 4,847,671 | 7/1989 | Pattanayak et al. . |
| 4,920,062 | 4/1990 | Tsunoda ............... 257/142 |
| 4,937,644 | 6/1990 | Baliga . |
| 4,942,445 | 7/1990 | Baliga et al. . |
| 4,963,950 | 10/1990 | Chang et al. . |
| 4,969,027 | 11/1990 | Baliga et al. . |
| 4,982,258 | 1/1991 | Baliga . |
| 4,990,975 | 2/1991 | Hagino ............... 257/142 |
| 5,032,881 | 7/1991 | Sardo et al. . |

OTHER PUBLICATIONS

"MOS Controlled Thyristors (MCT'S)"; V. A. K. Temple; 1984 IEDM; General Electric Company, Corporate Research & Dev. Ctr; pp. 282-285.
"The Insulated Gate Transistor: A New Three-Terminal MOS-Controlled Bipolar Power Device"; B. Jayant Baliga et al.; IEEE Transactions on Electron Devices; vol. ED-31, No. 6, Jun. 1984; pp. 821-828.
"The MOS-Gated Emitter Switched Thyristor"; B. Jayant Baliga; IEEE Electron Devices Letters, vol. 11, No. 2, Feb. 1990; pp. 75-77.
"Modern Power Devices"; B. Jayant Baliga; A Wiley-Interscience Publication; John Wiley & Sons; pp. 344-354; 401-404; 367-376.

Primary Examiner—Rolf Hille
Assistant Examiner—David B. Hardy
Attorney, Agent, or Firm—Flehr, Hohbach, Test, Albritton & Herbert

[57] ABSTRACT

An emitter-switched thyristor structure includes a remote turn-off electrode for reducing turn-off time and increasing maximum controllable operating current. The switched thyristor structure further includes anode and cathode electrodes, with the remote electrode being connected to the cathode electrode. A multi-layer body of semiconductor material has a first surface, as well as regenerative and non-regenerative portions each operatively coupled between the anode and cathode electrodes. The regenerative portion includes adjacent first, second, third and fourth regions of alternating conductivity type arranged respectively in series. Electrical contacts exist between the remote electrode and the second region, as well as between the anode electrode and the fourth region. The thyristor is turned on by applying an enabling voltage to an insulated gate electrode disposed adjacent the first surface such that a conductive channel is created in the regenerative portion via modulation of the conductivity therein. Similarly, the termination of regenerative operation is initiated by applying a non-enabling voltage to the gate electrode. The remote electrode collects any charges remaining in the second region of the regenerative portion subsequent to application of the non-enabling voltage and thereby expedites turn off of the emitter-switched thyristor.

9 Claims, 4 Drawing Sheets

MOS GATED THYRISTOR WITH REMOTE TURN-OFF ELECTRODE

The present invention relates generally to the field of four-layer, latching semiconductor devices, and particularly to methods for controlling the conduction characteristics of such devices by modulating the voltage applied to the gate electrode of a MOS field effect transistor (MOSFET) portion of the device.

BACKGROUND OF THE INVENTION

The development of power MOSFET's was at least in part motivated by the objective of reducing the control current required by power bipolar devices during forced turn-off. In bipolar devices the injection of minority carriers into their drift region reduces the resistance to forward current flow. These devices are capable of operation at appreciable current densities, but are relatively inefficient as a consequence of the large currents required during device turn-on and turn-off.

In contrast, the gate structure of the power MOSFET has a very high steady-state impedance. This allows control of the device by a voltage source, since only relatively small gate drive currents are required to charge and discharge the input gate capacitance. Unfortunately, the ease of gating the power MOSFET is offset by its high on-state resistance arising from the absence of minority carrier injection. Hence, a combination of low-resistance bipolar-type current conduction with MOS gate control would provide the desired features of high operating forward current density and low gate drive power.

Referring to the cross-sectional illustration of FIG. 1, a device known as an insulated gate bipolar transistor (IGBT) illustrates one approach to combining these features. In this type of structure most of the forward current flow occurs between the emitter and collector terminals of the vertical PNP bipolar transistor portion of the device. The on-state losses of the IGBT at high voltages are significantly less than those of power MOSFET's due to the injection of minority carriers (electrons) into the N-base drift region.

As shown in FIG. 2, a regenerative device known as MOS-controlled thyristor (MCT) exhibits less forward voltage drop than does the IGBT. This P-N-P-N structure can be regarded as two transistors-an upper NPN transistor and a lower PNP transistor-that are internally connected in such a fashion as to obtain regenerative feedback between each other. Specifically, a thyristor may be considered as a combination of PNP and NPN bipolar transistors connected such that the base of each is driven by the collector current of the other. Once the thyristor is turned on via the gate electrode such that the requisite transistor turn-on current is supplied each transistor then drives the other into saturation. At this juncture the thyristor is no longer under the control of its gate electrode and continues to operate even in the absence of gate drive current. This phenomenon is known as regenerative latch up.

Since thyristors are often used in high-power switching applications, the maximum turn-off current level is generally of considerable importance. The MCT device of FIG. 2 is turned off by reversing the polarity of the applied gate voltage so as to eliminate the accumulation layer at the surface of the N-region embedded between the P and P+ regions underlying the gate. In this way a p-channel field-effect transistor (FET) within the device forms an active short circuit between the N+ cathode and P-base regions. The device will cease regenerative operation when the short-circuit current increases to the extent that the voltage across the N+/P junction falls below 0.7 V. Unfortunately, the maximum current which can be switched off by the MCT markedly decreases with increasing anode voltages at elevated temperatures. As a consequence, the current handling capability of the MCT has proven to be inadequate for particular circuit applications.

FIG. 3 depicts a four-layer semiconductor structure, generally termed a MOS gated emitter switched thyristor (EST), also designed to operate in a regenerative mode. When the gate voltage is at the cathode potential the device is in a forward blocking mode with the anode voltage supported across junction J1. The device is turned on by applying a positive bias to the gate to create a channel at the surface of the P-base region. As shown in FIG. 3, the regenerative thyristor portion of the device latches upon forward bias of the junction between an N+ floating emitter and a P-base included within a lateral MOSFET structure at the surface of the device. Regenerative operation is extinguished by reducing the gate bias to zero, effectively disconnecting the emitter from the cathode. However, the N+/P junction of the thyristor does not become reverse biased until the regenerative action of the main thyristor is sufficiently attenuated. It follows that the lateral MOSFET at the surface of the structure is prone to break down during high-voltage device deactivation as a consequence of supporting the large junction voltage. Moreover, the elevated hole current through the cathode which arises during turn-off of the device may induce undesired regenerative operation within a parasitic thyristor (FIG. 3).

Accordingly, a need in the art exists for an emitter switched thyristor disposed to be turned off rapidly (i.e., less than 1 microsecond) without accompanying parasitic thyristor latch up.

SUMMARY OF THE INVENTION

The present invention addresses the foregoing objectives by providing an improved emitter switched thyristor structure having a remote turn-off electrode designed to improve maximum current turn-off capability and reduce device turn-off time. The improved thyristor structure includes anode and cathode electrodes, with the remote electrode being connected to the cathode electrode. A multi-layer body of semiconductor material has a first surface and includes regenerative and non-regenerative portions each operatively coupled between the anode and cathode electrodes. The regenerative portion includes adjacent first, second, third and fourth regions of alternating conductivity type arranged respectively in series. Electrical contact is made between the remote electrode and the second region, as well as between the anode electrode and the fourth region.

The inventive thyristor is turned on by applying an enabling voltage to an insulated gate electrode disposed adjacent the first surface such that a conductive channel is created in the regenerative portion via modulation of the conductivity therein. Similarly, the termination of regenerative operation is initiated by applying a non-enabling voltage to the gate electrode. The remote electrode collects any charges remaining in the second region of the regenerative portion subsequent to application of the non-enabling voltage and thereby expedites turn off of the inventive thyristor.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 4:
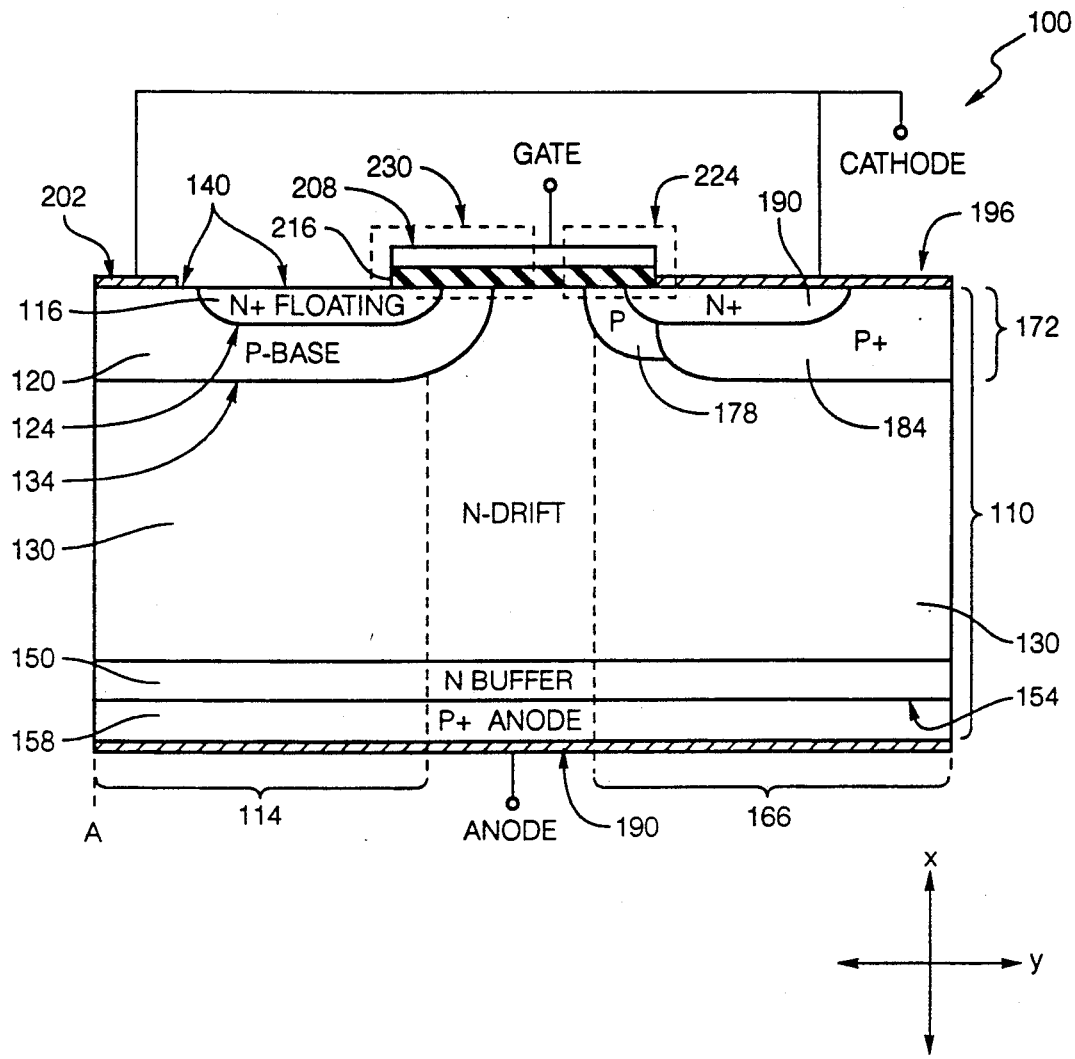
FIG. 4 shows a cross-sectional representation of a preferred embodiment of the inventive emitter switched semiconductor thyristor device with remote electrode.

Referring to FIG. 4, there is shown a cross-sectional representation of a preferred embodiment of the improved emitter switched semiconductor thyristor device 100 of the present invention. In order to simplify explanation only one-half of the inventive thyristor 100 is depicted in FIG. 4. The remaining one-half of the thyristor 100 comprises a mirror image, with respect to an axis A, of the one-half portion shown in FIG. 4. The thyristor 100 includes a body of semiconductor material 110 having a four layer or regenerative portion 114 constituted by a floating emitter region 116 of N+ conductivity material, and by a base region 120 of P conductivity material forming a first PN junction 124 with the floating emitter 116. A third layer of the regenerative portion of the thyristor device 100 is identified as a drift region 130 consisting of N-semiconductor material adjacent to and forming a second PN junction 134 with the base region 120. As shown in FIG. 4, the semiconductor body 110 is bounded by a substantially planar upper surface 140 defined in part by the uppermost portions of the floating emitter 116, base 120 and drift 130 regions. A set of reference rectangular coordinates are included in FIG. 4 and are used in the following description to specify direction.

The drift region 130 includes an optional N-type buffer region 150, and separates the base 120 from a fourth layer, or P+ anode region 158, of the regenerative portion of the thyristor 100. Adjacent to the four layer, regenerative portion 114 is a three layer, non-regenerative structure 166 comprised of a tri-component cathode region 172, the drift region 130, and the anode region 158. The cathode region 172 includes a well structure consisting of diffusions of P and P+ material 178 and 184, with an N+ diffusion 190 disposed within the well defined by diffusions 178 and 184.

Ohmic contacts exist between the lower surface of anode layer 158 and an anode electrode 192, as well as between the upper surface 140 of the P+ and N+ diffusions 184 and 190 and a cathode electrode 196. In addition, the base region 120 is in ohmic contact with a remote electrode 202 electrically coupled to the cathode electrode 196. Each region of the regenerative 114 and non-regenerative portions 166 of the improved thyristor 100 forms an elongated segment perpendicular to the plane of FIG. 4.

Referring to FIG. 4, an insulated gate electrode 208 overlaps the upper surface 140 of the regenerative 114 and non-regenerative 166 regions. Specifically, an oxide layer 216 separates the electrode 208 from the N+ diffusion 190, P diffusion 178 and drift region 130 so as to form a first N-channel enhancement mode MOS transistor 224. Similarly, a second N-channel enhancement mode MOS transistor 230 is created in series with the first transistor 224 by the portions of the floating emitter 116, base 120 and drift regions underlying the gate electrode 208.

Figure 1:
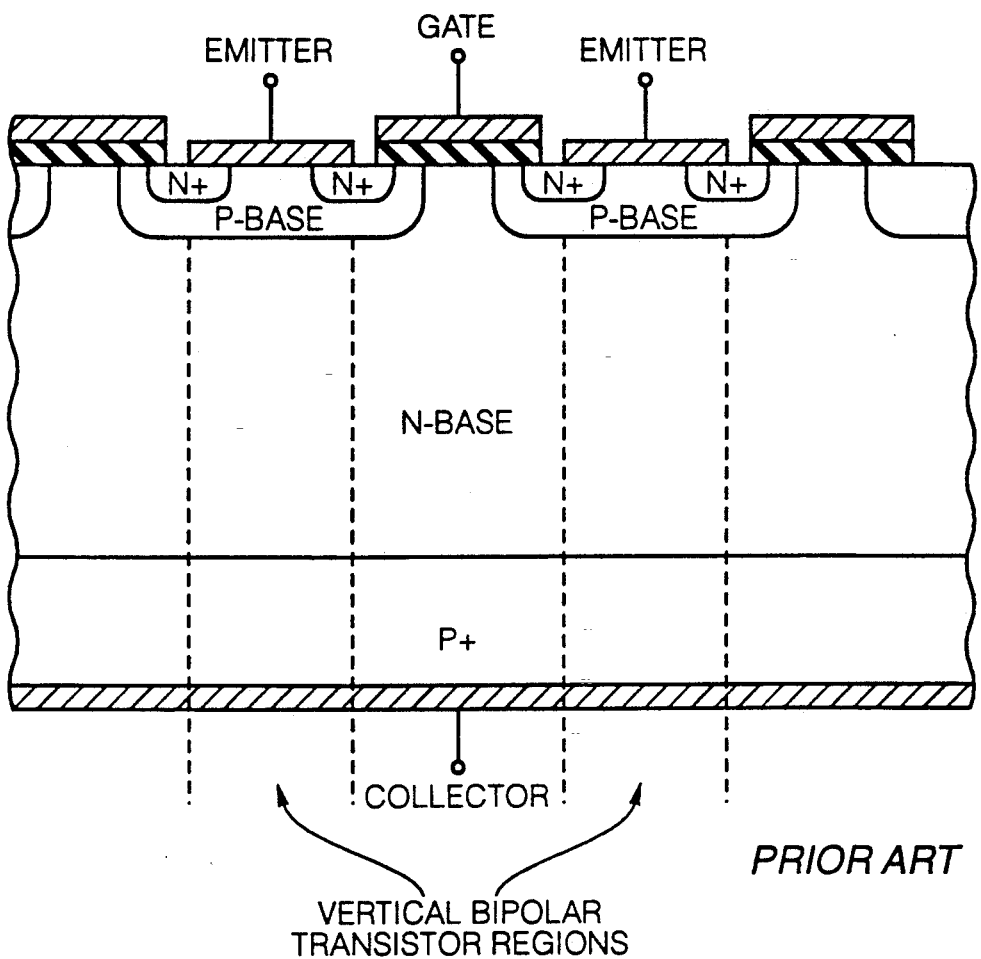
FIG. 1 is a cross-sectional illustration of a conventional insulated gate bipolar transistor (IGBT) device.
Figure 2:
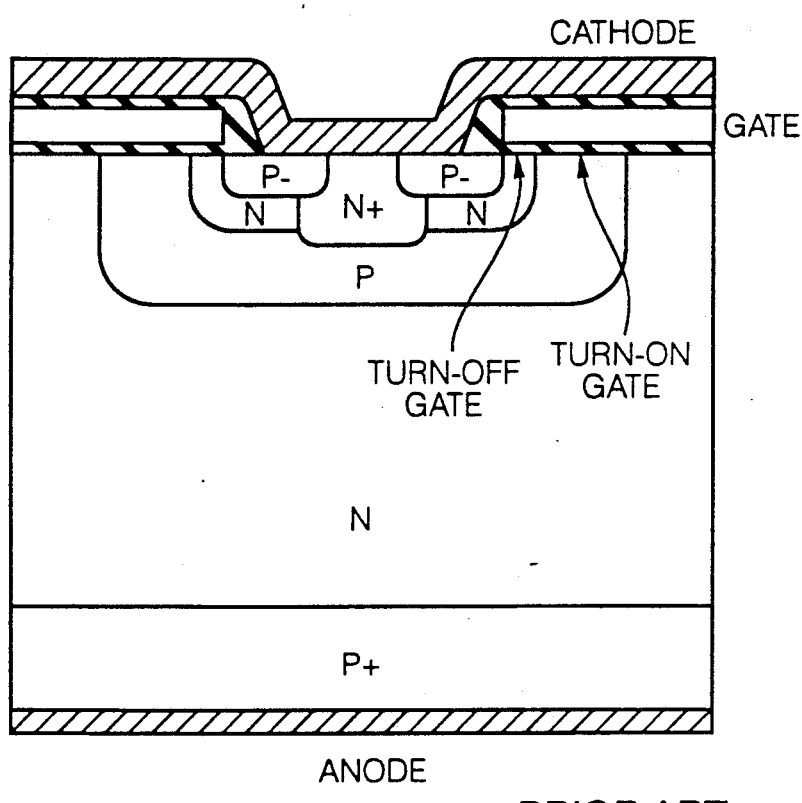
FIG. 2 shows a prior art P-N-P-N regenerative semiconductor device generally known as a MOS-controlled thyristor (MCT).

With the cathode and gate electrodes 196 and 208 held at the same potential the thyristor 100 is in a forward blocking mode. In the blocking mode any voltage differential between the anode and cathode electrodes 192 and 196 is primarily supported by the PN junction 134. The device may be turned on by applying a positive bias to the gate electrode 208 of sufficient magnitude to create inversion layers at the surface of the base regions 178 and 120 of the first and second MOS transistors 224 and 230. Although conductive channels are formed in both transistors 224 and 230 upon application of the requisite gate voltage, current initially flows exclusively through the first MOS transistor 224 due to the floating drain (i.e. the N+ emitter 116) of the second MOS transistor 230. At these low current levels the thyristor device 100 operates similarly to the conventional IGBT (Insulated Gate Bipolar Transistor) shown in FIG. 1. In IGBT mode operation the current flow through the regenerative portion 114 of the device 100 has not yet become self-sustaining, and hence the anode current remains dependent on the magnitude of the applied gate voltage.

Upon formation of the inversion layer in the first MOS transistor 224, electrons flow from the N+ region 190 into the drift region 130 where they serve as base current for the PNP transistor inherent within the four layer regenerative portion 114. When a sufficient voltage is applied to the anode electrode 192 the resulting current flow is adequate to induce regenerative thyristor action (i.e. latch up) within the four layer portion 114. Subsequent to the initiation of such action the anode current flow in the regenerative portion flows through both the first and second MOS transistors 224 and 230. The anode current may therefore be controlled by modulation of the applied gate voltage even after regenerative thyristor action takes place.

The onset of regenerative action (on-state) is precipitated by the flow of hole current to the remote electrode 202 through the segment of the base region 120 underlying the floating emitter 116. The sheet resistivity of the base 120 and length of the emitter 116 in the Y direction are selected to be such that the hole current develops the potential ($\approx 0.7$ Volts) required to forward bias the PN junction 124. Specifically, the floating emitter 116 will typically span approximately 20 microns in the Y direction while the sheet resistivity of the base 120 is generally 3000 ohms per square. The drift region 130 is dimensioned to extend approximately 50 microns from the N-type buffer region 150 to the PN junction 134, and is doped at $10^{14}/cm^3$. The carrier lifetimes within the drift region 130 are on the order of 1 microsecond, with the turn off time of the device 100 being affected thereby. The drift region doping level and thickness will generally be chosen to meet specified breakdown voltage requirements.

During operation in the on-state a substantial percentage of the anode current flows vertically through the regenerative portion 114, since it is in this region where the forward bias across PN junction 124 allows a large number of electrons to be injected into the drift region 130 from the floating emitter 116 of MOS transistor 230. Nonetheless, the PNP transistor comprising the diffusion 184, drift region 130 and anode layer 158 present within the non-regenerative portion 166 also contributes to the on-state current flow. At very high anode current densities (e.g. 1000 A/cm²) it is possible that a parasitic thyristor comprising the combination of the PNP transistor described above and the N+ diffusion 190 will latch up. As is explained more fully below, it is a feature of the present invention that the hole collection capability afforded by the remote electrode 202 reduces the likelihood of parasitic latch up during turn-off by reducing the current density proximate the PN junction between the diffusions 184 and 190.

When it desired to terminate regenerative operation the voltage impressed on the gate electrode 208 is reduced to zero. The surfaces of the P-type regions 178 and 120 will preferably be sufficiently narrow (e.g. 1 to 3 microns in the Y direction) that reduction in the gate voltage to zero will rapidly extinguish the conductive channels within the first and second MOS transistors. This disconnects the floating N+ emitter region 116 from the cathode electrode 196, thereby causing termination of regenerative thyristor action.

Figure 3:
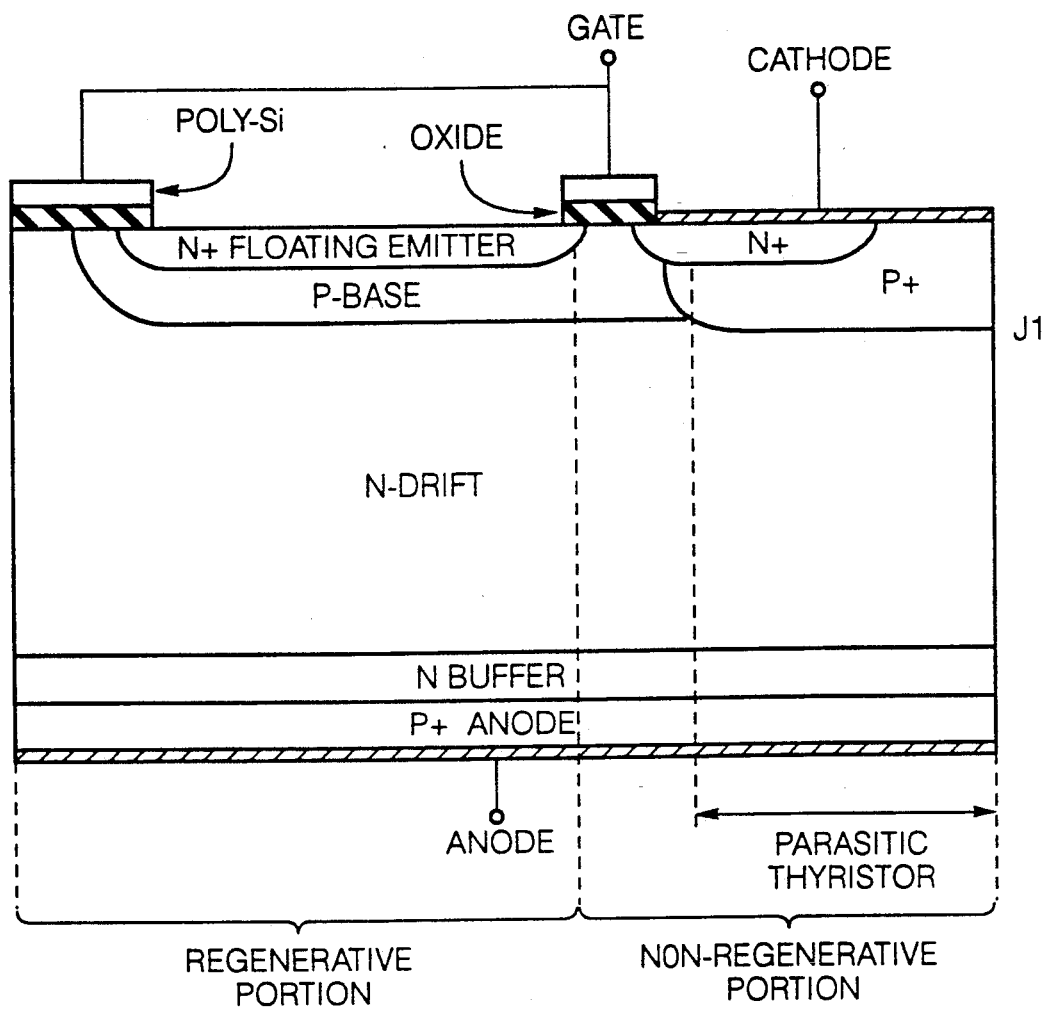
FIG. 3 depicts a conventional implementation of a four-layer MOS gated emitter switched thyristor (EST) semiconductor device.

As mentioned in the Background of the Invention, the lateral MOSFET within a conventional EST device (FIG. 3) is prone to break down when turn-off occurs at high anode voltages because of temporarily being required to support such voltages prior to termination of the regenerative action of the thyristor. The present invention addresses this shortcoming of prior art EST devices by provision of the remote electrode 202 to expedite charge removal from the base 120 upon reduction in the potential applied to the gate electrode 208. As shown in FIG. 3, the only manner in which holes can be drawn from the base region of the conventional EST device is through the cathode terminal. It follows that holes present in the regenerative portion of the device proximate the floating emitter must traverse the entire P-base region as well as the P+ diffusion in order to be collected, thus increasing the probability of latch up of the parasitic thyristor. Consequently, prior art EST devices are not generally capable of ceasing regenerative operation at high current densities. In contrast, a remote-electrode thyristor device fabricated in accordance with the present invention can operate at current densities above 1000 A/cm².

As may be appreciated by referring to FIG. 3, the structure of conventional EST devices results in a predisposition for latch up of the parasitic thyristor during turn-off. Specifically, reducing the applied gate voltage in order to initiate deactivation of the device induces a loss of channel conductivity between the N+ cathode diffusion and the floating emitter, thereby decoupling the floating emitter from the cathode. The forward bias across the PN junction between the P-base and floating emitter then diminishes as regenerative activity subsides, and an excess hole concentration develops proximate the floating emitter as fewer electrons are injected therefrom into the base. The requirement of charge neutrality forces these holes to the cathode via the P+ diffusion, thus resulting in a spike of hole current proximate the PN junction between the diffusions underlying the cathode. If of sufficient magnitude, the current spike may forward bias this PN junction and precipitate parasitic latch up.

Referring to FIG. 4, the remote electrode 202 serves to reduce any excess hole concentration developing in the base 120 during turn off of the inventive thyristor device 100. Specifically, holes present within the regenerative portion 114 of the device at the time of turn off will migrate along a low-impedance path to the remote electrode 202 rather than through the regions 178 and 184 to the cathode electrode 196. This eliminates the flow of excess holes from the base 120 through the cathode region 172, and hence minimizes the likelihood of undesired latch up of the parasitic thyristor.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. Specifically, the thyristor devices incorporating the teachings of the present invention may be embodied in semiconductor structures which differ from that depicted in FIG. 4. For example, the gate electrode may be bifurcated so as to independently control the formation of conductive channels within the regenerative and non-regenerative regions. In addition, the cathode region need not be realized using the specific arrangement of diffusions specified herein. Those skilled in the art may be aware of other structures for implementing the non-regenerative portion of the inventive thyristor.

What is claimed is:

1. A semiconductor thyristor device comprising:
   a substrate forming a drift region, a floating emitter region, a base region interposed between said drift region and said floating emitter region, and an anode region adjacent a portion of said drift region distal said base region, said base region being doped with P-type dopants to a first level of dopant concentration;
   a cathode region comprising a P-well adjacent said drift region and an N-region in said P-well, said P-well being doped with P-type dopants to a second level of concentration;
   wherein said second level of concentration exceeds said first level of concentration;
   a cathode electrode coupled to said cathode region;
   an anode electrode coupled to said anode region;
   a first insulated gate forming a first MOS transistor connecting said cathode electrode to said drift region when said first MOS transistor is enabled;
   a second insulated gate forming a second MOS transistor coupling said floating emitter region to said drift region when said second MOS transistor is enabled; and
   remote electrode means, coupled to said cathode electrode and to said base region and separated from said floating emitter region by said base region, for collecting charge carriers from said base region;
   wherein a current path from said anode to said cathode is formed by said first and second MOS transistors when an enabling voltage is applied to said first and second insulated gates, and wherein, when a non-enabling gate voltage is applied to said first and second MOS transistors said current path is shut off and any charges remaining in said base region are collected by said remote electrode.

2. The semiconductor thyristor device of claim 1 wherein said base region is formed from a P-type semiconductor, said floating emitter and drift regions are formed from an N-type semiconductor, and said anode region includes a layer of an N-type semiconductor.

3. The thyristor device of claim 2 wherein said remote electrode means includes a remote electrode connected to said base region proximate a first end of said floating emitter region, and wherein said second MOS transistor is formed proximate a second end of said floating emitter region.

4. The semiconductor device of claim 1 wherein said first and second insulated gates share a common gate electrode insulated from said floating emitter, base, drift and cathode regions by an insulating layer.

5. The semiconductor device of claim 1 wherein said cathode electrode is in electrical contact with both said P-well and said N-region therein.

6. A semiconductor thyristor device comprising:
anode and cathode electrodes;
a remote electrode connected to said cathode electrode;
a multi-layer body of semiconductor material having a first surface and including a regenerative portion and a non-regenerative portion each operatively coupled between said anode and cathode electrodes, said regenerative portion including adjacent first, second, third and fourth regions of alternating conductivity type arranged respectively in series wherein said first region of said regenerative portion is separated from said third region proximate said first surface by said second region, said remote electrode is in electrical contact with said second region and is separated from said first region thereby, and wherein said anode electrode is in electrical contact with said fourth region; and
an insulated gate electrode disposed adjacent said first surface for modulating electrical conductivity within said non-regenerative portion in order to turn said device on upon application of an enabling voltage to said gate electrode, and for modulating electrical conductivity within said second region of said regenerative portion and within said non-regenerative portion in order to turn said device off upon application of a non-enabling voltage to said gate electrode;
wherein any charges remaining in said second region of said regenerative portion are collected by said remote electrode subsequent to said application of said non-enabling voltage to said gate electrode.

7. The semiconductor device of claim 6 wherein said third region separates said second region and said non-regenerative portion adjacent said insulated gate electrode.

8. The semiconductor device of claim 7 wherein said non-regenerative portion includes a cathode region having a P-well adjacent said third region and an N-region in said P-well, said cathode electrode being connected to said P-well and said N-region.

9. A semiconductor thyristor device comprising:
anode and cathode electrodes;
a remote electrode connected to said cathode electrode;
a multi-layer body of semiconductor material having a first surface and including a regenerative portion and a non-regenerative portion each operatively coupled between said anode and cathode electrodes, said regenerative portion including adjacent first, second, third and fourth regions of alternating conductivity type arranged respectively in series wherein said first region of said regenerative portion is separated from said third region proximate said first surface by said second region, said remote electrode is in electrical contact with said second region and is separated from said first region thereby, and wherein said anode electrode is in electrical contact with said fourth region; and
a first insulated gate forming a first MOS transistor connecting said cathode electrode to said third region when said first MOS transistor is enabled; and
a second insulated gate forming a second MOS transistor coupling said first region to said third region when said second MOS transistor is enabled;
wherein a current path from said anode to said cathode is formed by said first and second MOS transistors when an enabling voltage is applied to said first and second insulated gates, and wherein, when a non-enabling gate voltage is applied to said first and second MOS transistors said current path is shut off and any charges remaining in said second region are collected by said remote electrode.

* * * * *